(12) United States Patent
Agarwal et al.

(10) Patent No.: US 10,655,224 B2
(45) Date of Patent: May 19, 2020

(54) CONICAL WAFER CENTERING AND HOLDING DEVICE FOR SEMICONDUCTOR PROCESSING

(71) Applicant: Lam Research Corporation, Fremont, CA (US)

(72) Inventors: Pulkit Agarwal, Hillsboro, OR (US); Ishtak Karim, Portland, OR (US); Purushottam Kumar, Hillsboro, OR (US); Adrien LaVoie, Newberg, OR (US); Sung Je Kim, Beaverton, OR (US); Patrick Breiling, Portland, OR (US)

(73) Assignee: Lam Research Corporation, Fremont, CA (US)

( * ) Notice: Subject to any disclaimer, the term of this patent is extended or adjusted under 35 U.S.C. 154(b) by 481 days.

(21) Appl. No.: 15/385,813

(22) Filed: Dec. 20, 2016

(65) Prior Publication Data

US 2018/0171473 A1    Jun. 21, 2018

(51) Int. Cl.
*C23C 16/458* (2006.01)
*C23C 16/50* (2006.01)
(Continued)

(52) U.S. Cl.
CPC ...... *C23C 16/4581* (2013.01); *C23C 16/4585* (2013.01); *C23C 16/50* (2013.01);
(Continued)

(58) Field of Classification Search
CPC ............... C23C 16/4581; C23C 16/50; C23C 16/45544; H01L 21/68764; H01L 21/68735; H01L 21/68771; H01J 37/32642
See application file for complete search history.

(56) References Cited

U.S. PATENT DOCUMENTS 5,645,646 A * 7/1997 Beinglass ......... H01L 21/68735
118/500
5,766,824 A * 6/1998 Batchelder .............. G03F 7/168
134/21

(Continued)

FOREIGN PATENT DOCUMENTS

EP          0840358 A2   6/1998
JP        2010-16183 A    1/2010

OTHER PUBLICATIONS

PCT Notification of Transmittal of the International Search Report and the Written Opinion of the International Searching Authority, issued in corresponding International Patent Application No. PCT/US2017/066870 (Forms ISA 220, 210, and 237), dated Mar. 28, 2018 (14 total pages).

*Primary Examiner* — Jeffrie R Lund
(74) *Attorney, Agent, or Firm* — Penilla IP, APC

(57) ABSTRACT

A semiconductor system includes a chamber, a pedestal disposed in the chamber, and a focus ring that surrounds the pedestal. The pedestal has a center region for supporting a central region of a substrate, e.g., a wafer. The focus ring is configured to surround the center region of the pedestal. The focus ring has an annular support region that extends between an inner portion of the focus ring and an outer portion of the focus ring. The annular support region, which is disposed at an angle relative to a horizontal line, provides a knife-edge contact for the substrate when present over the center region of the pedestal and the annular support region of the focus ring. The knife-edge contact between the edge of the substrate and the annular support region of the focus ring disables chemical access to the substrate backside and thereby reduces unwanted backside deposition.

20 Claims, 9 Drawing Sheets

(51) Int. Cl.
*H01L 21/687* (2006.01)
*C23C 16/455* (2006.01)
*H01J 37/32* (2006.01)

(52) U.S. Cl.
CPC .. *H01L 21/68735* (2013.01); *H01L 21/68764* (2013.01); *H01L 21/68771* (2013.01); *C23C 16/45544* (2013.01); *H01J 37/32642* (2013.01)

(56) References Cited

U.S. PATENT DOCUMENTS

| | | | |
|---|---|---|---|
| 6,315,878 B1* | 11/2001 | Patadia | C23C 14/50 118/500 |
| 6,395,363 B1* | 5/2002 | Ballance | H01L 21/68735 118/500 |
| 9,870,917 B2* | 1/2018 | Kang | H01J 37/32467 |
| 2002/0029745 A1* | 3/2002 | Nagaiwa | C23C 16/4581 118/723 E |
| 2002/0162630 A1 | 11/2002 | Satoh et al. | |
| 2007/0051472 A1* | 3/2007 | Murakami | H01J 37/32642 156/345.51 |
| 2007/0169891 A1* | 7/2007 | Koshiishi | H01J 37/32642 156/345.47 |
| 2007/0215279 A1* | 9/2007 | Koshiishi | H01J 37/32623 156/345.3 |
| 2007/0258186 A1* | 11/2007 | Matyushkin | H01L 21/67109 361/234 |
| 2008/0236749 A1* | 10/2008 | Koshimizu | H01J 37/32091 156/345.33 |
| 2008/0295872 A1* | 12/2008 | Riker | H01J 37/32357 134/105 |
| 2008/0314319 A1 | 12/2008 | Hamano et al. | |
| 2010/0133257 A1* | 6/2010 | Sorabji | H01L 21/67115 219/447.1 |
| 2010/0300622 A1* | 12/2010 | Yatsuda | H01J 37/32091 156/345.44 |
| 2011/0031111 A1* | 2/2011 | Kobayashi | H01J 37/32623 204/192.34 |
| 2011/0048643 A1* | 3/2011 | Endoh | H01J 37/32642 156/345.41 |
| 2011/0126852 A1* | 6/2011 | Dhindsa | C23C 16/4405 134/1.1 |
| 2011/0126984 A1* | 6/2011 | Kang | H01J 37/32091 156/345.51 |
| 2011/0272100 A1 | 11/2011 | Koshiishi | |
| 2012/0006491 A1* | 1/2012 | Park | H01L 21/67271 156/345.51 |
| 2013/0025538 A1* | 1/2013 | Collins | H01L 21/67115 118/712 |
| 2013/0175005 A1* | 7/2013 | Gowdaru | F28F 3/00 165/84 |
| 2013/0186858 A1* | 7/2013 | Suzuki | H01J 37/32623 216/67 |
| 2014/0273486 A1* | 9/2014 | Katsunuma | H01J 37/32082 438/710 |
| 2015/0107773 A1* | 4/2015 | Shintaku | H01J 37/32275 156/345.41 |
| 2015/0162170 A1* | 6/2015 | Kishi | H01J 37/32642 156/345.51 |
| 2015/0168130 A1* | 6/2015 | Matsudo | H01J 37/3288 156/345.24 |
| 2015/0170925 A1* | 6/2015 | Chen | H01J 37/32045 438/758 |
| 2016/0204019 A1* | 7/2016 | Ishii | C30B 35/005 269/296 |
| 2016/0216185 A1* | 7/2016 | Gottscho | G01N 3/56 |
| 2016/0289827 A1 | 10/2016 | Augustyniak | C23C 16/4585 |
| 2016/0315021 A1* | 10/2016 | Berkoh | H01J 37/32642 |
| 2016/0343547 A1* | 11/2016 | Lim | H01J 37/32642 |
| 2017/0069471 A1* | 3/2017 | Seok | H01J 37/32642 |
| 2017/0148624 A1* | 5/2017 | Verhaverbeke | H01L 21/67173 |
| 2017/0352575 A1* | 12/2017 | Gangakhedkar | H01L 21/67017 |
| 2018/0171473 A1* | 6/2018 | Agarwal | C23C 16/4581 |
| 2018/0286640 A1* | 10/2018 | Cue | H01J 37/32642 |

* cited by examiner

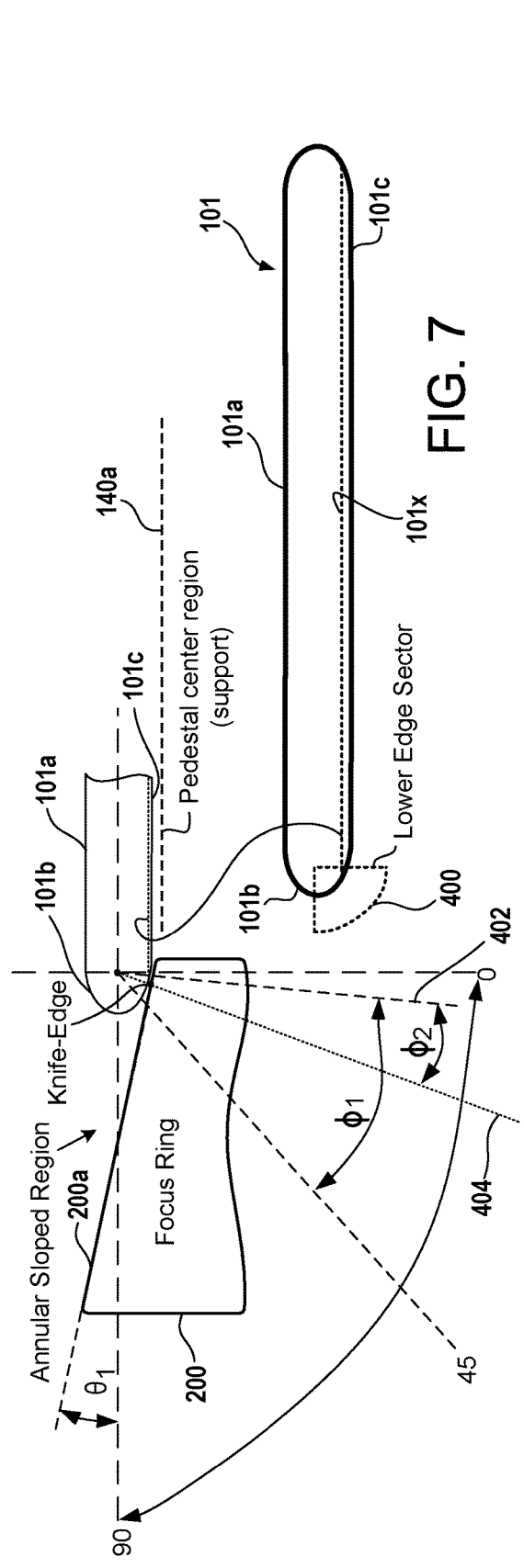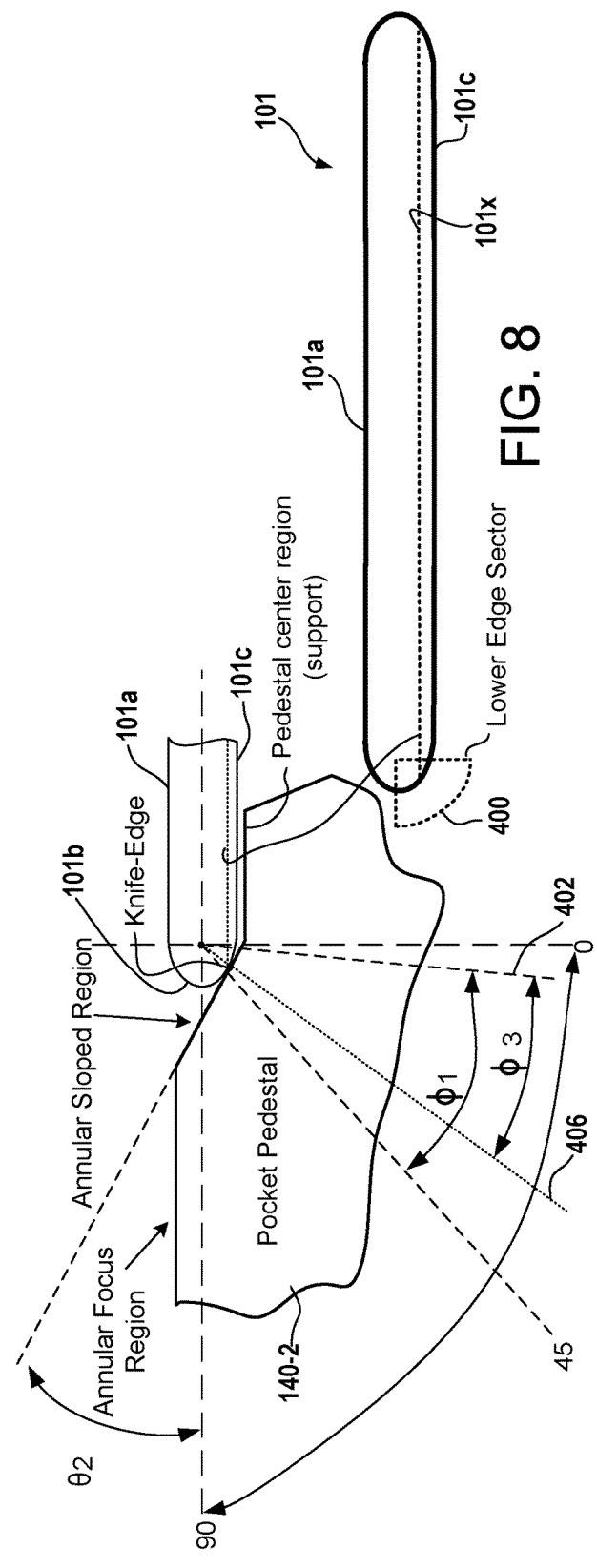

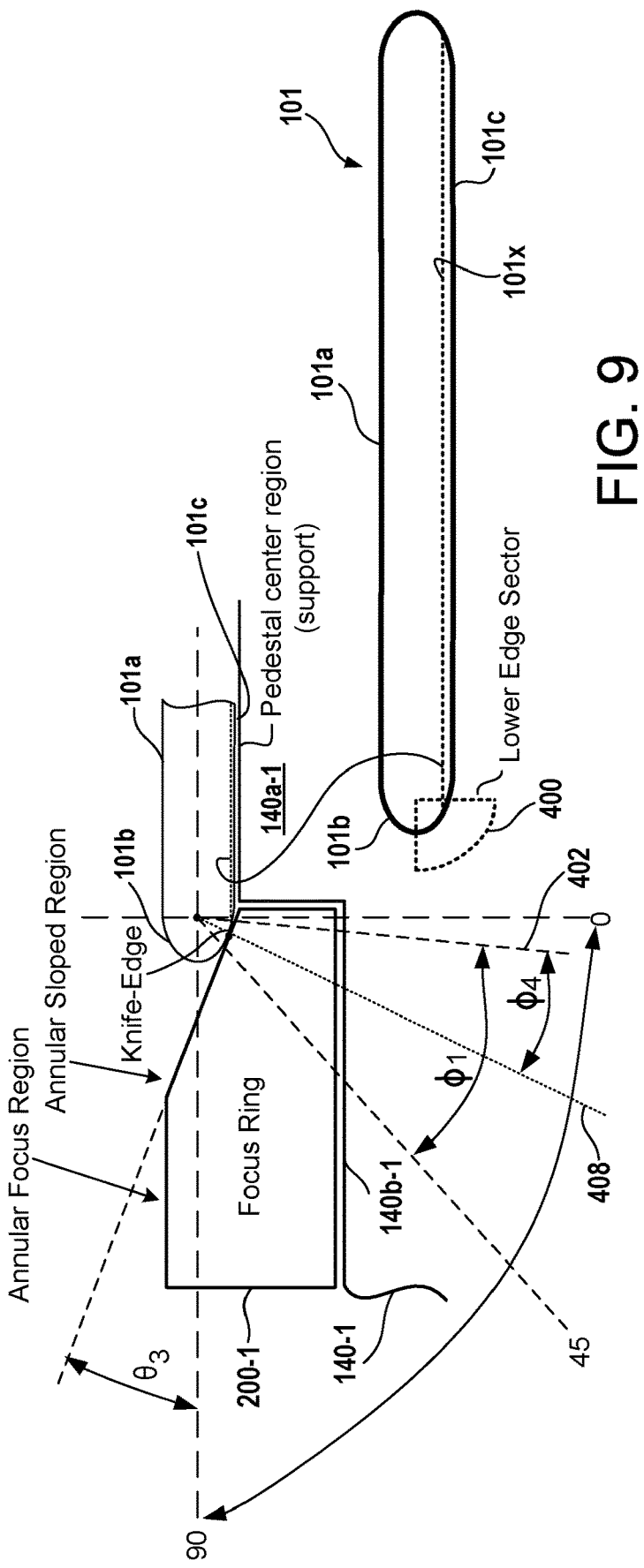

CONICAL WAFER CENTERING AND HOLDING DEVICE FOR SEMICONDUCTOR PROCESSING

BACKGROUND

In atomic layer deposition (ALD), a film is deposited layer by layer by successive dosing and activation steps. ALD is used to generate conformal films on high aspect ratio structures. One of the drawbacks of ALD is that film deposition on the backside of the wafer is difficult to avoid because the film can be deposited through any gap accessing the wafer backside. Backside deposition is unwanted for a number of reasons, one of which is that excess film on the backside of the wafer is susceptible to flaking, e.g., during wafer transport. If flakes from the backside of the wafer come into contact with a wafer (either the same wafer or a different wafer), the wafer is contaminated and defects can result.

In capacitive coupled plasma chambers, a small gap is desired between the pedestal and the wafer. This gap induces impedance between the wafer and the pedestal that is sufficient to essentially drown out the impedance variations caused by variations of the pedestal surfaces on the micro scale. To create the small gap between the pedestal and the wafer, minimum contact area (MCA) features are used to create a level virtual offset place with supports that ensure a flat wafer plane. As noted above, the gap between the pedestal and the wafer provides access to the backside of the wafer and thereby facilitates film deposition on the backside of the wafer.

Pedestals used in conventional ALD and plasma-enhance chemical vapor deposition (PECVD) systems typically include multiple MCA features that are adjustable in height. The current pedestal design guidelines specify the use of enough MCA features to ensure that the support plane created by these features holds a wafer parallel to the pedestal. Indeed, a design is considered inadequate if the number of MCA features used allows for wafer deflection or sag. Thus, in some pedestal designs, more than 30 MCA features are used to support the wafer.

It is in this context that embodiments arise.

SUMMARY

In an example embodiment, a semiconductor system includes a chamber, a pedestal disposed in the chamber, and a focus ring that surrounds the pedestal. The pedestal has a center region for supporting a central region of a substrate, e.g., a wafer. The focus ring is configured to surround the center region of the pedestal. The focus ring has an annular support region that extends between an inner portion of the focus ring and an outer portion of the focus ring. The annular support region, which is disposed at an angle relative to a horizontal line, provides a knife-edge contact for the substrate when present over the center region of the pedestal and the annular support region of the focus ring.

In one example, the annular support region of the focus ring is disposed at an angle in the range from 1 degree to 25 degrees. In another example, the annular support region of the focus ring is disposed at an angle in the range from 1 degree to 15 degrees. In yet another example, the annular support region of the focus ring is disposed at an angle in the range from 5 degrees to 10 degrees.

In one example, the annular support region has a surface roughness in the range from 1-32 Ra. In another example, the annular support region has a surface roughness in the range from 2-15 Ra.

In one example, the focus ring is comprised of a metallic material, a dielectric material, or a coated material. In one example, the focus ring is comprised of aluminum or stainless steel. In one example, the focus ring is comprised of alumina ($Al_2O_3$) or yttria ($Y_2O_3$).

In another example embodiment, a semiconductor system includes a chamber and a pocket pedestal disposed in the chamber. The pocket pedestal has a center region, an annular focus region, and an annular sloped region. The center region of the pocket pedestal is for supporting a central region of a substrate. The annular focus region surrounds the center region of the pocket pedestal. The annular sloped region, which extends from the center region to the annular focus region, defines an annular support that provides a knife-edge contact for the substrate when present over the center region and the annular sloped region.

In one example, the annular sloped region has a conical configuration. In one example, the annular sloped region of the pocket pedestal is disposed at an angle in the range from 1 degree to 25 degrees. In another example, the annular sloped region of the pocket pedestal is disposed at an angle in the range from 1 degree to 15 degrees. In yet another example, the annular sloped region of the pocket pedestal is disposed at an angle in the range from 5 degrees to 10 degrees.

In one example, the annular sloped region has a surface roughness in the range from 1-32 Ra. In another example, the annular sloped region has a surface roughness in the range from 2-15 Ra.

In yet another example embodiment, a semiconductor system includes a chamber, a pedestal disposed in the chamber, and a focus ring that surrounds the pedestal. The pedestal has a center region for supporting a central region of a substrate, e.g. a wafer, and a peripheral region surrounding the center region. The peripheral region is a step down from the center region. The focus ring is configured to surround the center region of the pedestal. The focus ring, which is disposed over the peripheral region of the pedestal, has an annular support region that extends between an inner portion of the focus ring and an outer portion of the focus ring. The annular support region, which is disposed at an angle in the range from 1 degree to 15 degrees relative to a horizontal line, has a surface roughness in the range from 2-15 Ra. The annular support region provides a knife-edge contact for the substrate when present over the center region of the pedestal and the annular support region of the focus ring.

In one example, the knife-edge contact between the annular support region of the focus ring and the substrate when present seals off gaseous chemical access to a backside of the wafer to a degree sufficient to reduce backside deposition.

In one example, the annular support region of the focus ring is disposed at an angle in the range from 5 degrees to 10 degrees relative to a horizontal line. In one example, the focus ring is comprised of a material selected from the group consisting of aluminum, stainless steel, alumina ($Al_2O_3$), and yttria ($Y_2O_3$).

Other aspects and advantages of the disclosures herein will become apparent from the following detailed description, taken in conjunction with the accompanying drawings, which illustrate by way of example the principles of the disclosures.

BRIEF DESCRIPTION OF THE DRAWINGS

FIG. 7 is a simplified schematic view of the knife-edge contact between the wafer edge and the upper surface of a focus ring, in accordance with an example embodiment.

FIG. 8 is a simplified schematic view of the knife-edge contact between the wafer edge and the upper surface of the annular sloped region of a pocket pedestal, in accordance with an example embodiment.

FIG. 9 is a simplified schematic view of the knife-edge contact between the wafer edge and the upper surface of the annular sloped region of a pedestal, in accordance with an example embodiment.

DETAILED DESCRIPTION

In the following description, numerous specific details are set forth in order to provide a thorough understanding of the example embodiments. However, it will be apparent to one skilled in the art that the example embodiments may be practiced without some of these specific details. In other instances, process operations and implementation details have not been described in detail, if already well known.

Figure 1:
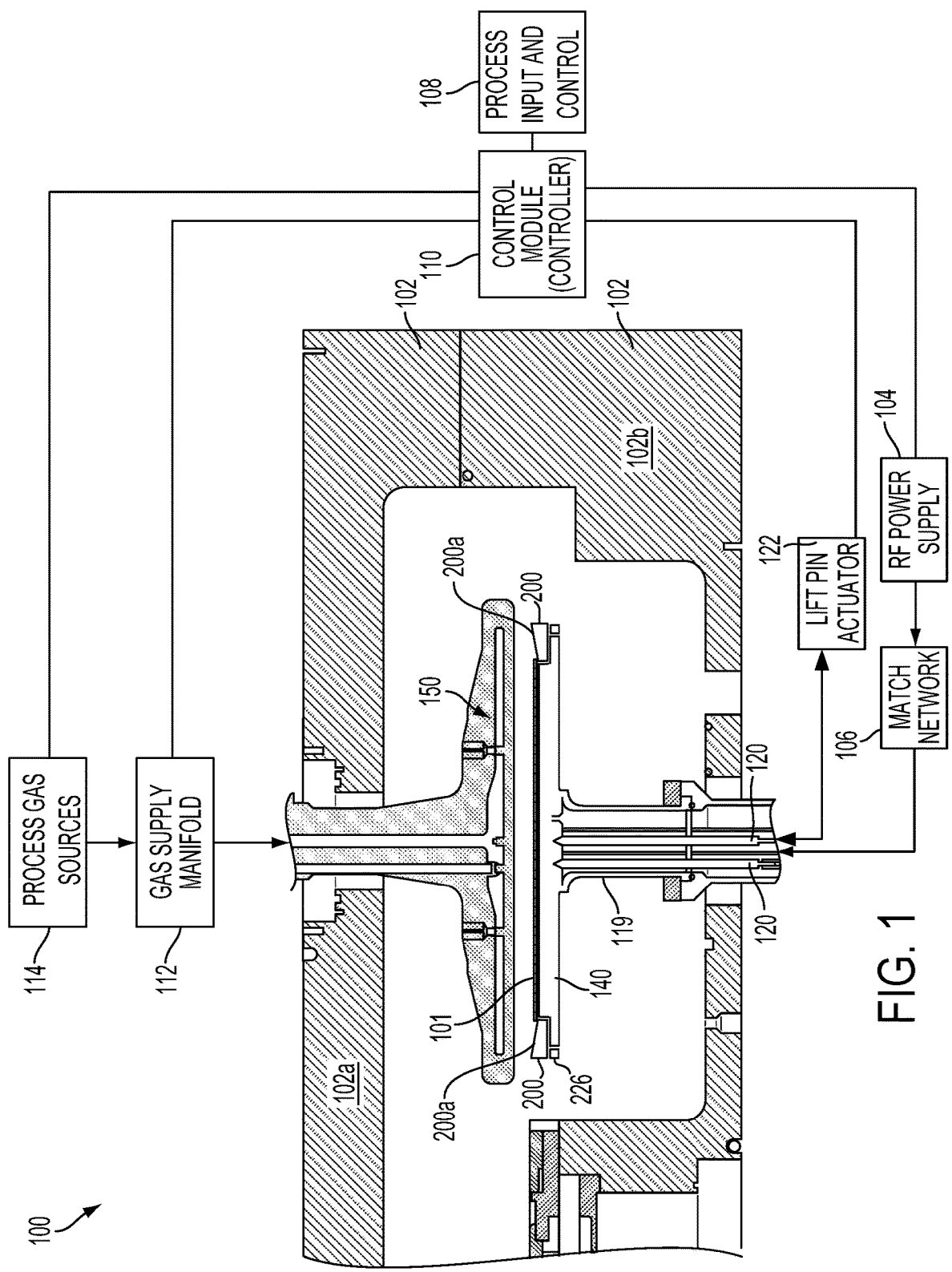
FIG. 1 is a schematic diagram that shows a substrate processing system, which is used to process a wafer, in accordance with an example embodiment.

FIG. 1 illustrates a substrate processing system 100, which is used to process a wafer 101. The system includes a chamber 102 having a lower chamber body 102b and an upper chamber body 102a. A center column 119 is configured to support a pedestal 140, which in one embodiment is a powered electrode. The pedestal 140 is defined by a pedestal assembly that includes the center column 119 and a pedestal body that includes a substrate support surface. The pedestal 140 is electrically coupled to power supply 104 via a match network 106. The power supply is controlled by a control module 110, e.g., a controller. The control module 110 is configured to operate the substrate processing system 100 by executing process input and control 108. The process input and control 108 may include process recipes, such as power levels, timing parameters, process gases, mechanical movement of the wafer 101, etc., such as to deposit or form films over the wafer 101 via ALD methods or PECVD methods.

The center column is also shown to include lift pins 120, which are controlled by lift pin control 122. The lift pins 120 are used to raise the wafer 101 from the pedestal 140 to allow an end-effector to pick the wafer and to lower the wafer 101 after being placed by the end end-effector. The substrate processing system 100 further includes a gas supply manifold 112 that is connected to process gases 114, e.g., gas chemistry supplies from a facility. Depending on the processing being performed, the control module 110 controls the delivery of process gases 114 via the gas supply manifold 112. The chosen gases are then flown into the shower head 150 and distributed in the volume of space defined between the showerhead 150 and the wafer 101 resting over the pedestal 140.

Further, the gases may be premixed or not. Appropriate valves and mass flow control mechanisms may be employed to ensure that the correct gases are delivered during the deposition and plasma treatment phases of the process. Process gases exit chamber via an outlet. A vacuum pump (e.g., a one or two stage mechanical dry pump and/or a turbo-molecular pump) draws process gases out and maintains a suitably low pressure within the reactor by a close loop controlled flow restriction device, such as a throttle valve or a pendulum valve.

Also shown is a carrier focus ring 200 that encircles an outer region of the pedestal 140. The carrier focus ring 200 is configured to sit over a ring support region that is a step down from a wafer support region in the center of the pedestal 140. The carrier focus ring 200 includes an outer edge side of its disk structure, e.g., outer radius, and a wafer edge side of its disk structure, e.g., inner radius, that is closest to where the wafer 101 sits. The upper surface 200a of the carrier focus ring 200 is sloped to provide a conical knife-edge that permits wafer edge contact and functions as a wafer sliding ramp to 1) enable variable temperature wafer centering and 2) seal off gaseous chemical access to the wafer backside and thereby reduce wafer backside deposition. Additional details regarding the structure and functionality of the upper surface of a carrier focus ring (or focus ring or pocket pedestal) are described below with reference to FIGS. 4-10. The carrier focus ring 200 is lifted along with the wafer 101 and can be rotated to another station, e.g., in a multi-station system. As mentioned above, in some embodiments, the carrier focus ring 200 is not used for lifting the wafer 101 via spider forks 226. In those embodiments, the wafers 101 are lifted with end effectors (not shown) without moving the carrier focus ring 200.

Figure 2:
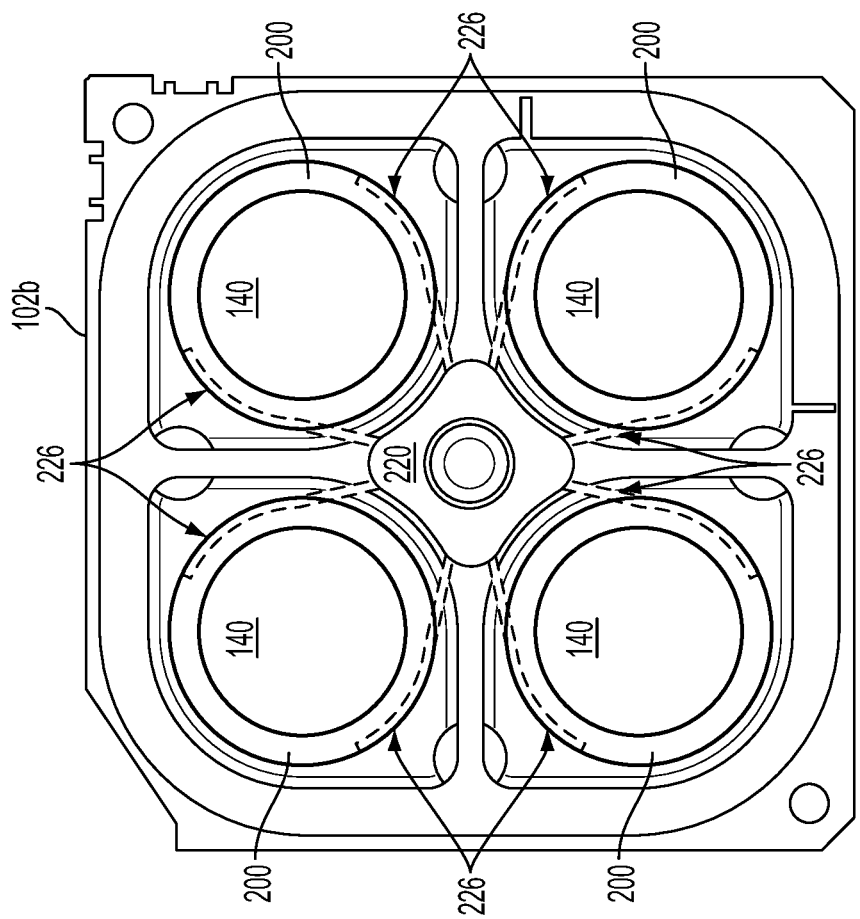
FIG. 2 illustrates a top view of a multi-station processing tool, wherein four processing stations are provided.

FIG. 2 illustrates a top view of a multi-station processing tool, wherein four processing stations are provided. This top view is of the lower chamber body 102b (e.g., with the top chamber portion 102a removed for illustration), wherein four stations are accessed by spider forks 226. Each spider fork or forks includes a first and second arm, each of which is positioned around a portion of each side of the pedestal 140. In this view, the spider forks 226 are drawn in dash-lines, to convey that they are below the carrier ring 200. The spider forks 226 are coupled to a rotatable spindle 220 that is configured to raise up and lift the carrier focus rings 200 (i.e., from a lower surface of the carrier focus rings 200) from the stations simultaneously, and then rotate one or more stations before lowering the carrier focus rings 200 (where at least one of the carrier focus rings supports a wafer 101) at a next location so that further plasma processing, treatment and/or film deposition can take place on respective wafers 101.

Figure 3:
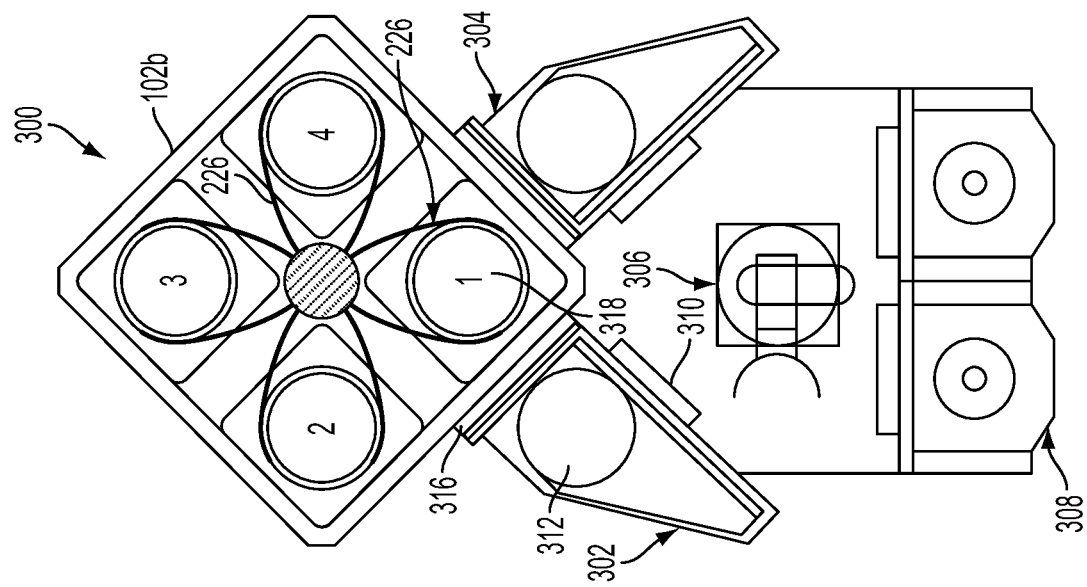
FIG. 3 shows a schematic view of an embodiment of a multi-station processing tool with an inbound load lock and an outbound load lock.

FIG. 3 shows a schematic view of an embodiment of a multi-station processing tool 300 with an inbound load lock 302 and an outbound load lock 304. A robot 306, at atmospheric pressure, is configured to move substrates from a cassette loaded through a pod 308 into inbound load lock 302 via an atmospheric port 310. Inbound load lock 302 is coupled to a vacuum source (not shown) so that, when atmospheric port 310 is closed, inbound load lock 302 may be pumped down. Inbound load lock 302 also includes a chamber transport port 316 interfaced with processing chamber 102b. Thus, when chamber transport port 316 is opened, another robot (not shown) may move the substrate from inbound load lock 302 to a pedestal 140 (see FIG. 2) of a first process station for processing.

The depicted processing chamber 102b comprises four process stations, numbered from 1 to 4 in the embodiment shown in FIG. 3. In some embodiments, processing chamber 102b may be configured to maintain a low pressure environment so that substrates may be transferred using a carrier focus ring 200 among the process stations without experiencing a vacuum break and/or air exposure. Each process station depicted in FIG. 3 includes a process station substrate holder (shown at 318 for station 1) and process gas delivery line inlets.

In some embodiments, a "ring-less" substrate transfer may also be employed. In such embodiments, the carrier ring remains fixed on one station. The substrate is moved by lifting the substrate off of the pedestal with pins, inserting a paddle under the wafer, and then lowering the substrate on pins thus ensuring direct contact with the paddle to substrate. At this point, the substrate is indexed using the paddle to another station. Once the substrate is at the new station, the substrate is lifted off of the paddle with pins, the paddle is rotated or moved out and the pins are lowered to ensure direct contact of the substrate to the pedestal. Now, the substrate processing can proceed at the new station for the indexed (i.e., moved) substrate. When the system has multiple stations, each of the substrates (i.e., those present at stations) can be transferred together, e.g., simultaneously, in the similar fashion for ring-less substrate transfers.

Figure 4:
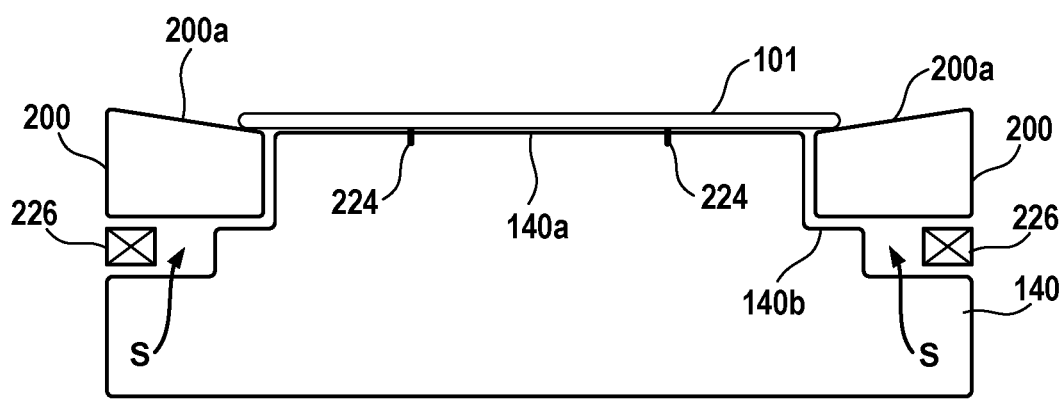
FIG. 4 is a schematic diagram that illustrates an enlarged, cross-sectional view of the carrier focus ring and pedestal shown in FIG. 1, in accordance with an example embodiment.

FIG. 4 is a schematic diagram that illustrates an enlarged, cross-sectional view of carrier focus ring 200 and pedestal 140 shown in FIG. 1. As shown in FIG. 4, carrier focus ring 200 surrounds the wafer support region 140a in the central portion of pedestal 140. The carrier focus ring 200 sits over a ring support region 140b that is a step down from the wafer support region 140a. Spider fork 226 is disposed below carrier focus ring 200 so that the spider fork can lift and rotate the carrier focus ring in the manner described above. As shown in FIG. 4, spider fork 226 is situated below carrier focus ring 200 in the space S defined by a step down from the ring support region 140b. Wafer 101 is supported over pedestal 140 by minimum contact area (MCA) supports 224, which contact the backside of the wafer, and upper surface 200a of carrier focus ring 200, which contacts the edge of the wafer. Two MCA supports 224 are visible in the example of FIG. 4; however, those skilled in the art will appreciate that the number of MCA supports used to provide support for wafer 101 will vary depending on, e.g., the size of the wafer, the processing temperature, etc. By way of example, the number of MCA supports can range from 3 to 30. The MCA supports 224, which are typically made of sapphire, support the wafer 101 over the surface of the wafer support region of pedestal 140 by a distance typically in the range of 1-10 mils (one mil=0.001 inch).

Pedestal 140 and focus carrier ring 200 can be made from a variety of suitable materials. For example, the pedestal and the focus carrier ring can be made of metal (e.g., aluminum (Al), stainless steel, etc.), dielectric (e.g., alumina ($Al_2O_3$), yttria ($Y_2O_3$), etc.), or a coated material (e.g., aluminum coated with yttria or alumina). Wafer 101 is made of a suitable semiconductor material, e.g., silicon (Si). Semiconductor deposition processes can be conducted over a broad range of temperatures depending upon the type of film to be deposited on the substrate (e.g., wafer) and the chemistry used for depositing the film. For example, the deposition temperature for depositing an oxide may be less than about 100 degrees C. and, in some embodiments, less than about 50 degrees C. The deposition temperature for depositing a nitride or carbide is typically less than about 400 degrees C. but, in some embodiments, can be greater than 400 degrees C. Thus, broadly speaking, the deposition temperature may be within the range from 20 degrees C. to 700 degrees C. In one embodiment, the deposition temperature is within the range from 100 degrees C. to 550 degrees C. In another embodiment, the deposition temperature is within the range from 300 degrees C. to 450 degrees C., e.g., about 400 degrees C. As used herein with regard to temperature, the term "about" means±10 degrees C. Thus, by way of example, a temperature of "about 400 degrees C." indicates a temperature of 390 degrees C. to 410 degrees C.

During transport and processing, it is undesirable for the wafer 101 to move, e.g., by sliding on focus carrier ring 200. With this in mind, the surface roughness of the upper surface 200a of the carrier focus ring 200 should be chosen so that the kinetic friction provided by the upper surface substantially offsets the downward force of gravity. Further, the degree of roughness of the upper surface 200a should not only allow the contact seal provided at the edge the wafer 101 to effectively restrict gaseous chemical access to the backside of the wafer (to restrict deposition on the wafer backside), but also avoid the generation of particles when contacted by the wafer. To obtain a workable balance of the foregoing factors, the upper surface 200a of the carrier focus ring 200 should be relatively smooth. In some embodiments, the upper surface 200a of the carrier focus ring 200 has a surface roughness in the range of 1-32 Ra. In one embodiment, the upper surface of the carrier focus ring has a surface roughness in the range of 2-15 Ra, e.g., 4 Ra.

Figure 5:
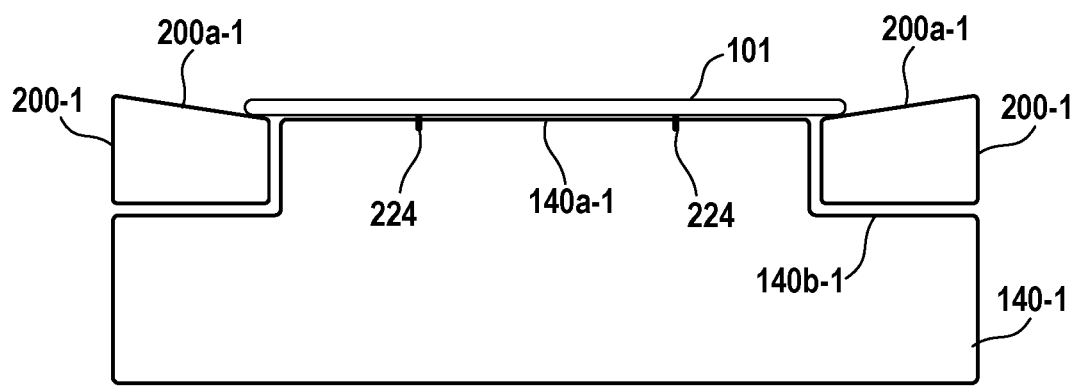
FIG. 5 is a schematic diagram that illustrates an enlarged, cross-sectional view of a focus ring and pedestal, in accordance with an example embodiment.

FIG. 5 is a schematic diagram that illustrates an enlarged, cross-sectional view of a focus ring and pedestal, in accordance with an example embodiment. The arrangement shown in FIG. 5 is the same as that shown in FIG. 4, with the exception that the pedestal 140-1 is not configured to accommodate spider fork 226 shown in FIG. 4. As such, focus ring 200-1 is not used to carry wafer 101, whereas carrier focus ring 200 (FIG. 4) is used to carry the wafer. For this reason, focus ring 200-1 is referred to as a "focus ring" and carrier focus ring 200 is referred to as a "carrier focus ring." As shown in FIG. 5, focus ring 200-1 surrounds the wafer support region 140a-1 in the central portion of pedestal 140-1. The focus ring 200-1 sits over a ring support region 140b-1 that is a step down from the wafer support region 140a-1. The upper surface 200a-1 of focus ring 200-1 has the same configuration as upper surface 200a of carrier focus ring 200 shown in FIG. 4.

Figure 6A:
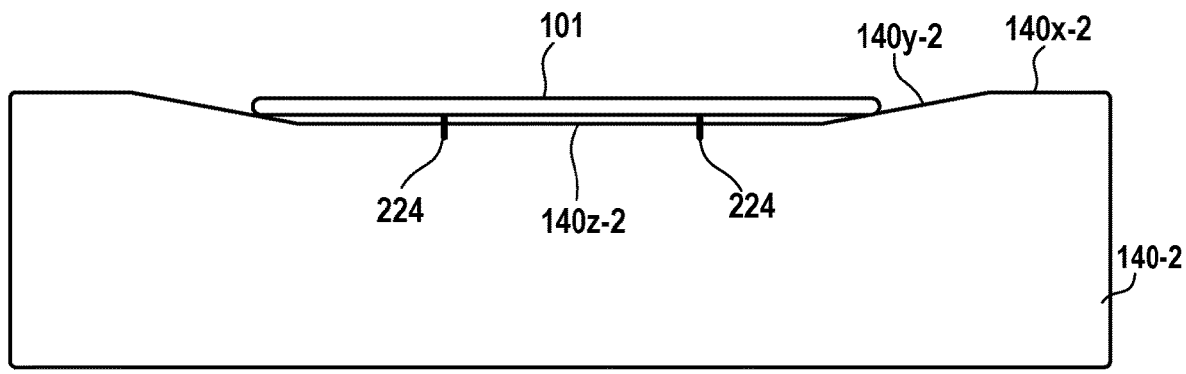
FIG. 6A is a simplified cross-sectional view of a monolithic pocket pedestal that includes an integral focus ring, in accordance with an example embodiment.
Figure 6B:
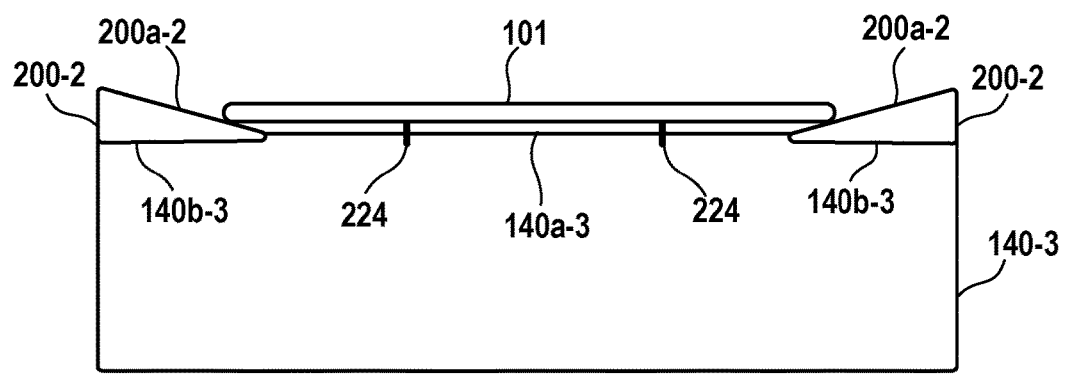
FIG. 6B is simplified cross-sectional view of a pocket pedestal that has a stationary focus ring disposed thereon, in accordance with an example embodiment.
Figure 6C:
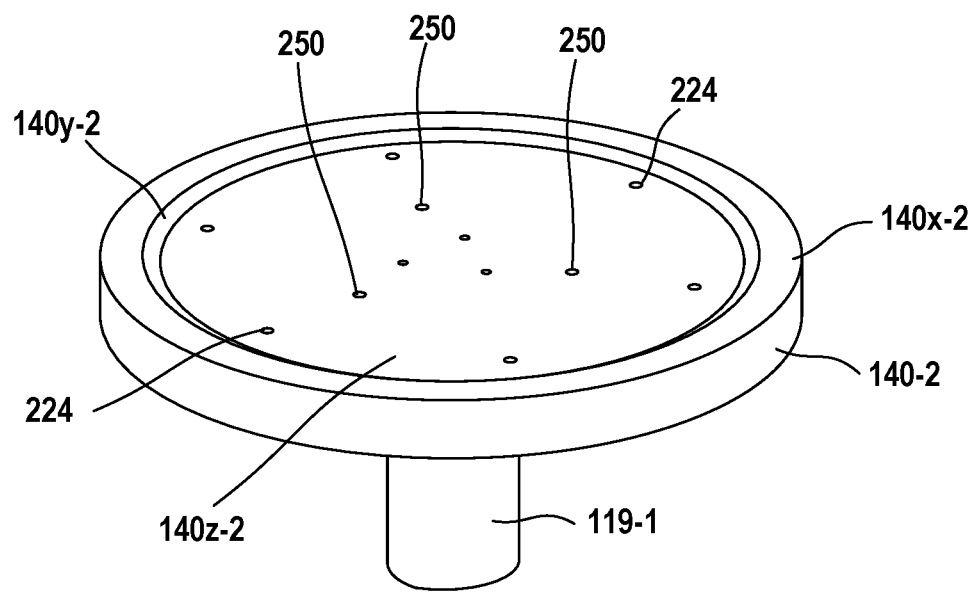
FIG. 6C is a simplified perspective view of a monolithic pocket pedestal that includes an integral focus ring, in accordance with an example embodiment.

FIGS. 6A, 6B, and 6C illustrate other examples of devices in which a conical configuration can be implemented to center and hold a wafer. FIG. 6A is a simplified cross-sectional view of a monolithic pocket pedestal that includes an integral focus ring. As shown in FIG. 6A, monolithic pocket pedestal 140-2 has an upper surface 140x-2, an annular surface 140y-2, and a wafer support surface 140z-2. Upper surface 140x-2 is a flat surface that surrounds annular surface 140y-2 and defines the boundary of the annular focus region of the pocket pedestal 140-2. Annular surface 140y-2 is sloped to provide a conical knife-edge form factor for receiving wafer 101, as described herein. Wafer support surface 140z-2 is provided with a number of MCA supports 224 for supporting wafer 101 over the wafer support surface. As discussed above, the number of MCA supports 224 can range from 3 to 30.

With the configuration shown in FIG. 6A, the monolithic pocket pedestal 140-2 functions as a focus ring. In this configuration, the annular sloped surface 140y-2 and the outer portion of the pocket pedestal 140-2 are integrally formed with the pocket pedestal. Alternatively, a separate focus ring can be attached to the pocket pedestal, as described in more detail below with reference to FIG. 6B.

FIG. 6B is a simplified cross-sectional view of a monolithic pocket pedestal that includes a stationary focus ring that is used in tandem with a pocket pedestal. As shown in FIG. 6B, focus ring 200-2 surrounds the wafer support region 140a-3 of pocket pedestal 140-3. In one example, focus ring 200-2 can be attached to pocket pedestal 140-3 at ring support region 140b-3, which is a step down from the wafer support region 140a-3, form the monolithic structure. The upper surface 200a-2 of focus ring 200-2 is sloped to provide a conical knife-edge form factor for receiving wafer 101, as described herein. A suitable number of MCA supports 224 are provided to support the wafer 101 over the wafer support region 140a-3.

FIG. 6C is a simplified perspective view of a monolithic pocket pedestal that includes an integral focus ring. The assembly shown in FIG. 6C includes monolithic pocket pedestal 140-2, which has a configuration similar to that shown in FIG. 6A, supported on center column 119-1. Pocket pedestal 140-2 has an upper surface 140x-2, an annular surface 140y-2, and a wafer support surface 140z-2. Upper surface 140x-2 is a flat surface that surrounds annular surface 140y-2 and defines the boundary of the annular focus region of the pocket pedestal 140-2. Annular surface 140y-2 is sloped to provide a conical knife-edge form factor for centering and supporting a wafer, as described herein. Wafer support surface 140z-2 is provided with lift pin holes 250 and a number of MCA supports 224 (or holes in which MCA supports may be disposed) for supporting a wafer over the wafer support surface. The lift pin holes 250 are typically arranged in a star pattern and allow lift pins, which are situated within center column 119-1, to pass through the wafer support surface 140z-2 and engage the bottom surface (backside) of the wafer for transport.

FIGS. 7-9 illustrate additional details regarding the knife-edge contact between the wafer edge and the upper surface of a focus ring or a pocket pedestal. FIG. 7 is a simplified schematic view of the knife-edge contact between the wafer edge and the upper surface of a focus ring that further includes an enlarged view of the wafer. As shown in FIG. 7, wafer 101 has a non-edge surface 101a, an edge surface 101b, and a bottom surface 101c. The non-edge surface 101a is the active top surface of wafer 101 and the bottom surface 101c is the backside of the wafer. The edge surface 101b begins at the point where the edge transition begins, which is indicated in FIG. 7 by the vertical dashed line labeled as indicating the zero degree reference point. The center point of the edge surface 101b is indicated by the horizontal dashed line labeled as indicating the 90 degree reference point. This horizontal 90 degree reference line is substantially parallel to the top surface of the wafer support region of the pedestal (indicated by the dashed line 140a in FIG. 7). The upper surface 200a of focus ring 200 is sloped to enable knife-edge contact between the edge surface 101b of wafer 101 and the upper surface of the focus ring. As shown in FIG. 7, the upper surface is sloped at angle, $\theta_1$, relative to a horizontal line, e.g., the dashed horizontal 90 degree reference line shown in FIG. 7. In some embodiments, the angle, $\theta_1$, is in the range from 1 degree to 25 degrees. It will be appreciated by those skilled in the art that the slope of the upper surface 200a of the focus ring 200 could be greater than 25 degrees; however, at such steeper slopes it is likely that the wafer would slide on the upper surface of the wafer, depending upon the balance between the competing forces of kinetic friction, which is a function of surface roughness, and gravity. Sliding of the wafer 101 on the upper surface 200a of the focus ring 200 is undesirable because it not only can adversely impact wafer centering but also can result in increased particle generation. Thus, in one embodiment, the angle, $\theta_1$, is in the range from 1 degree to 15 degrees. In another embodiment, the angle, $\theta_1$, is in the range from 5 degrees to 10 degrees.

It will be appreciated by those skilled in the art that the sloped upper surface 200a of focus ring 200 has a conical configuration due to the annular shape of the focus ring. As shown in FIG. 7, the edge surface 101b of the wafer 101 interfaces with the upper surface 200a of focus ring 200 around the periphery of the wafer along the dashed line 101x. Along the interface between the edge surface 101b and the upper surface 200a, gaseous chemical access to bottom surface 101c (the backside) of wafer 101 is sealed off wherever the edge surface of the wafer is in physical contact with the upper surface of the focus ring. By disabling gaseous chemical access to the wafer backside using such knife-edge contact, backside deposition is reduced.

Depending upon numerous parameters, e.g., the size of the wafer, the angle (θ) of the annular sloped region of the focus ring (or pocket pedestal), the curvature of the edge surface of the wafer, etc., the knife-edge contact between the edge surface of the wafer and the upper surface of the focus ring can occur at different locations within lower edge sector 400 of the wafer 101. As shown in FIG. 7, the region within the lower edge sector at which knife-edge contact can occur is defined by the angle, $\phi_1$, which spans from the dashed line 402 disposed at a slight angle relative to the vertical dashed line indicating the zero degree reference point and the dashed line labeled as indicating the 45 degree reference point. The dashed line 402 is defined by a first point at the intersection of the horizontal 90 degree reference line and the vertical zero degree reference line and a second point on the edge surface 101b that corresponds to the point at the which the edge surface has undergone sufficient curvature away from horizontal bottom surface 101c to enable knife-edge contact between the edge surface and the upper surface 200a of pedestal 200.

In the example shown in FIG. 7, the edge surface 101b and the upper surface 200a of focus ring 200 are in knife-edge contact at the point (as shown in a two-dimensional drawing) where dashed line 404 intersects with the edge surface. It will be appreciated that this knife-edge contact between edge surface 101b and upper surface 200a extends around the periphery of the wafer 101, as indicated by the dashed line 101x. In FIG. 7, the knife-edge contact occurs at the angle, $\phi_2$, which is defined by dashed lines 402 and 404, within the lower edge sector 400.

FIG. 8 is a simplified schematic view of the knife-edge contact between the wafer edge and the upper surface of the annular sloped region of a pocket pedestal that further includes an enlarged view of the wafer. As shown in FIG. 8, edge surface 101b of wafer 101 is in knife-edge contact with the annular sloped region (see, e.g., annular surface 140y-2 in FIG. 4) of pocket pedestal 140-2 at the point (as shown in a two-dimensional drawing) where dashed line 406 intersects with the edge surface. It will be appreciated that this knife-edge contact between edge surface 101b and the surface of the annular sloped region extends around the periphery of the wafer 101, as indicated by the dashed line 101x. The annular sloped region of pocket pedestal 140-2 is disposed at an angle, $\theta_2$, relative to a horizontal line, e.g., the horizontal 90 degree reference line. In FIG. 8, the knife-edge contact occurs at the angle, $\phi_3$, which is defined by dashed lines 402 and 406, within the lower edge sector 400. The angle, $\phi_3$, is larger than the angle, $\phi_2$, shown in FIG. 7. This means that the knife-edge contact illustrated in FIG. 8 occurs more toward the center point of the edge surface 101b than the knife-edge contact illustrated in FIG. 7.

FIG. 9 is a simplified schematic view of the knife-edge contact between the wafer edge and the upper surface of the annular sloped region of a pedestal that further includes an enlarged view of the wafer. As shown in FIG. 9, focus ring 200-1 surrounds the wafer support region 140a-1 in the central portion of pedestal 140-1. The focus ring 200-1 sits over ring support region 140b-1 that is a step down from the wafer support region 140a-1. Edge surface 101b of wafer 101 is in knife-edge contact with the annular sloped region (see, e.g., upper surface 200a-1 in FIG. 5) of pedestal 140-1 at the point (as shown in a two-dimensional drawing) where dashed line 408 intersects with the edge surface. It will be appreciated that this knife-edge contact between edge surface 101b and the upper surface of the annular sloped region extends around the periphery of the wafer 101, as indicated by the dashed line 101x. The annular sloped region of focus ring 200-1 is disposed at an angle, $\theta_3$, relative to a horizontal line, e.g., the horizontal 90 degree reference line. In FIG. 9, the knife-edge contact occurs at the angle, $\phi_4$, which is defined by dashed lines 402 and 408. Those skilled in the art will appreciate that the angle which indicates where the knife-edge contact occurs, e.g., angle $\phi_4$, is related to the angle of the annular sloped region, e.g., angle $\theta_3$. For example, assuming all pertinent parameters to be the same except for the angles, if the angle $\theta_2$ (see FIG. 8) is larger than the angle $\theta_3$ (see FIG. 9), then the angle $\phi_3$ (see FIG. 8) will be larger than the angle $\phi_4$ (see FIG. 9).

Referring now to FIG. 7, sloped upper surface 200a of focus ring 200 enables a wafer to sit at variable heights relative to the pedestal while maintaining knife-edge contact between the edge of the wafer and the upper surface of the focus ring. Thus, focus ring 200 can accommodate variations in wafer diameter for a given wafer size, e.g., 200 mm, 300 mm, and 450 mm, while still reducing backside deposition. Moreover, the sloped upper surface 200a of focus ring 200 is capable of enabling variable temperature processing to account for variable bow of the wafer. In particular, with regard to wafer bow, the edge of the wafer will maintain knife-edge contact with the upper surface of the focus ring whether the bow of the wafer is concave or convex. As will be appreciated by those skilled in the art, at an elevated processing temperature, e.g., about 400 degrees C., the wafer and the focus ring will expand at different rates because these components are made from different materials, which have different coefficients of thermal expansion. Generally speaking, the pertinent parameters (e.g., materials selection, slope, surface roughness, etc.) are selected to ensure that the wafer is either in a planar condition (flat) or is bowed in a center high state (where the edge of the wafer is lower than the center of the wafer) during processing. Those skilled in the art will appreciate that the foregoing principles also apply to the configurations illustrated in, for examples, FIGS. 8 and 9.

The conical upper surface of the focus ring can also help with ion focusing depending upon the conductivity of the focus ring. For example, making the conical focus ring from either a dielectric material or a conductive material would have a greater impact on the direction of ion focusing relative to a conventional (non-conical) focus ring because there is no gap between the conical focus ring and the wafer. Further, in the case of a dielectric conical focus ring, ions could be directed away from the wafer. In the case of a highly conductive focus ring, ions could be directed toward the wafer. Moreover, if a material such as a titanium doped ceramic is used where conductivity can be precisely controlled (e.g., by varying the titanium doping), then the ion focusing could also be controlled.

Figure 10:
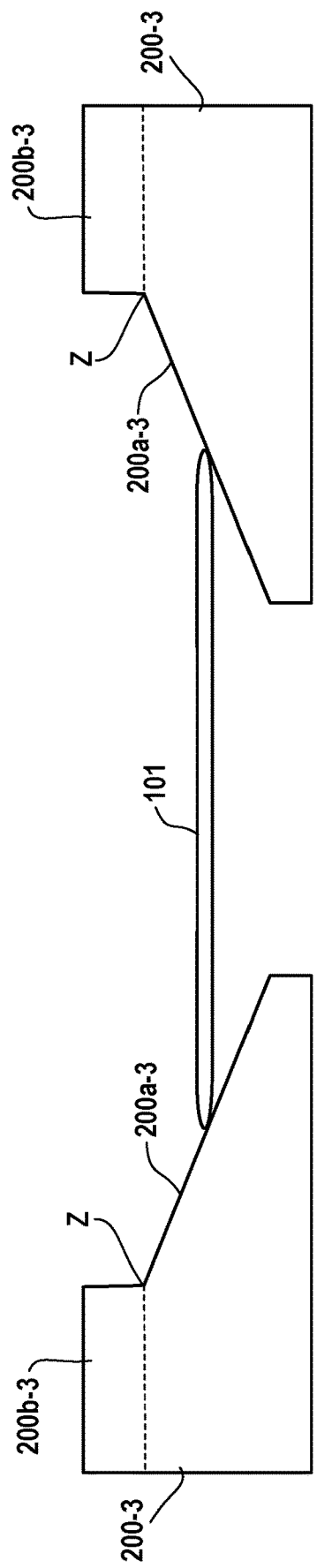
FIG. 10 is a simplified cross-sectional view of a focus ring that includes a vertical extension portion, in accordance with an example embodiment.

FIG. 10 is a simplified cross-sectional view of a focus ring that includes a vertical extension portion, in accordance with an example embodiment. As shown in FIG. 10, wafer 101 is situated on the sloped upper surface 200a-3 of focus ring 200-3. Vertical extension portion 200b-3 extends vertically relative to the outer periphery Z of the sloped upper surface 200a-3. As such, vertical extension portion 200b-3 includes the annular region defined above the dashed line shown in FIG. 10. The vertical extension portion 200b-3 can function as fluid baffle structure to manage process gas flow vectors within the processing region to assist with stabilization of the wafer. The vertical expansion portion 200b-3 also acts as a barrier in case of wafer sliding due to coulombic forces or asymmetric drag force from gas flow. Those skilled in the art will appreciate that a vertical extension portion also can be incorporated into the other structures described herein for providing a conical knife-edge form factor, e.g., a pocket pedestal (see, for example, FIGS. 6A and 6C).

Figure 11:
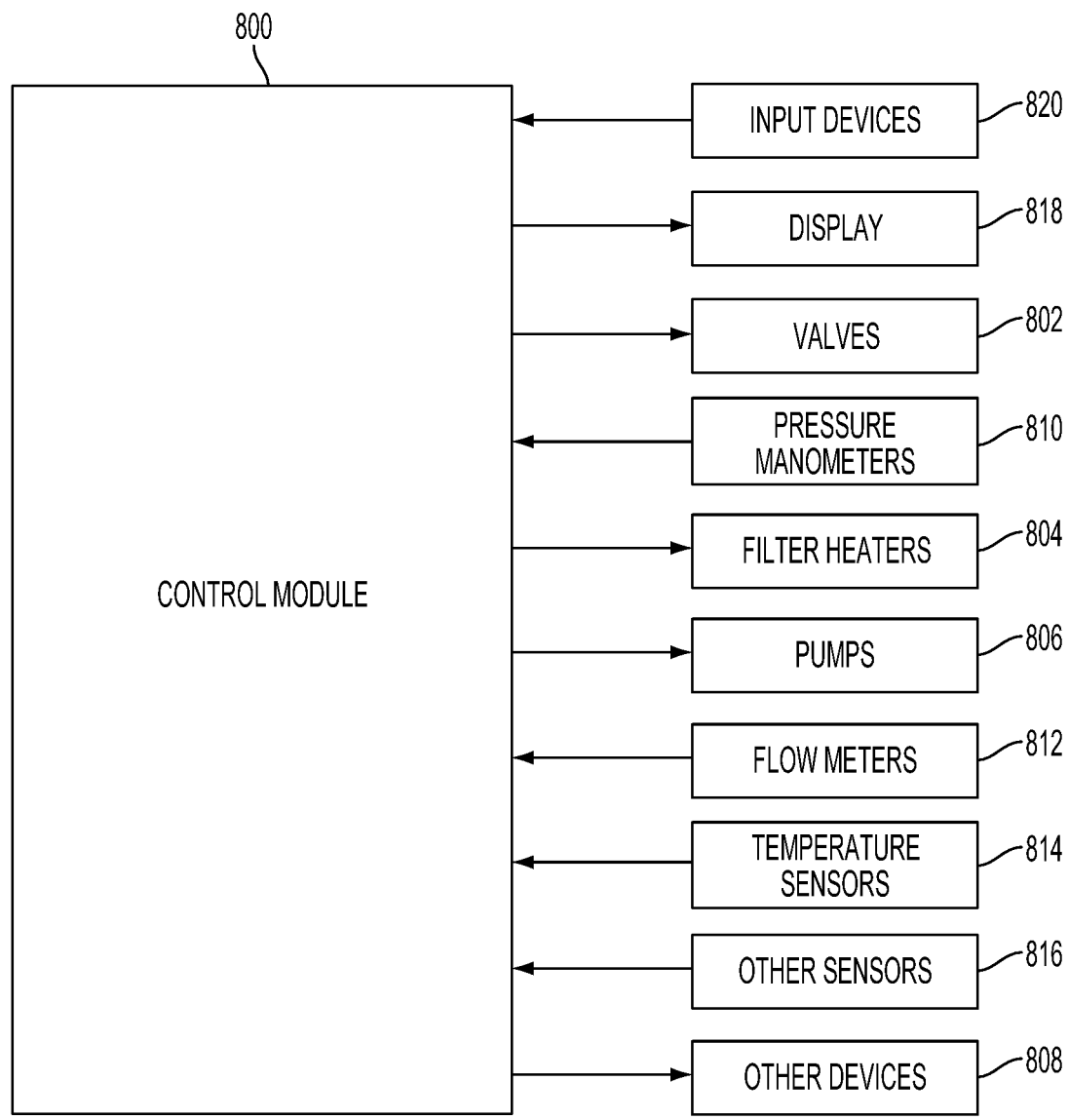
FIG. 11 shows a control module for controlling a processing system, in accordance with an example embodiment.

FIG. 11 shows a control module 800 for controlling the systems described above. In one embodiment, the control module 110 of FIG. 1 may include some of the example components. For instance, the control module 800 may include a processor, memory and one or more interfaces. The control module 800 may be employed to control devices in the system based in part on sensed values. For example only, the control module 800 may control one or more of valves 802, filter heaters 804, pumps 806, and other devices 808 based on the sensed values and other control parameters. The control module 800 receives the sensed values from, for example only, pressure manometers 810, flow meters 812, temperature sensors 814, and/or other sensors 816. The control module 800 may also be employed to control process conditions during precursor delivery and deposition of the film. The control module 800 will typically include one or more memory devices and one or more processors.

The control module 800 may control activities of the precursor delivery system and deposition apparatus. The control module 800 executes computer programs including sets of instructions for controlling process timing, delivery system temperature, pressure differentials across the filters, valve positions, mixture of gases, chamber pressure, chamber temperature, wafer temperature, RF power levels, wafer chuck or pedestal position, and other parameters of a particular process. The control module 800 may also monitor the pressure differential and automatically switch vapor precursor delivery from one or more paths to one or more other paths. Other computer programs stored on memory devices associated with the control module 800 may be employed in some embodiments.

Typically there will be a user interface associated with the control module 800. The user interface may include a display 818 (e.g. a display screen and/or graphical software displays of the apparatus and/or process conditions), and user input devices 820 such as pointing devices, keyboards, touch screens, microphones, etc.

Computer programs for controlling delivery of precursor, deposition and other processes in a process sequence can be written in any conventional computer readable programming language: for example, assembly language, C, C++, Pascal, Fortran or others. Compiled object code or script is executed by the processor to perform the tasks identified in the program.

The control module parameters relate to process conditions such as, for example, filter pressure differentials, process gas composition and flow rates, temperature, pressure, plasma conditions such as RF power levels and the low frequency RF frequency, cooling gas pressure, and chamber wall temperature.

The system software may be designed or configured in many different ways. For example, various chamber component subroutines or control objects may be written to control operation of the chamber components necessary to carry out the inventive deposition processes. Examples of programs or sections of programs for this purpose include substrate positioning code, process gas control code, pressure control code, heater control code, and plasma control code.

A substrate positioning program may include program code for controlling chamber components that are used to load the substrate onto a pedestal or chuck and to control the spacing between the substrate and other parts of the chamber such as a gas inlet and/or target. A process gas control program may include code for controlling gas composition and flow rates and optionally for flowing gas into the chamber prior to deposition in order to stabilize the pressure in the chamber. A filter monitoring program includes code comparing the measured differential(s) to predetermined value(s) and/or code for switching paths. A pressure control program may include code for controlling the pressure in the chamber by regulating, e.g., a throttle valve in the exhaust system of the chamber. A heater control program may include code for controlling the current to heating units for heating components in the precursor delivery system, the substrate and/or other portions of the system. Alternatively, the heater control program may control delivery of a heat transfer gas such as helium to the wafer chuck.

Examples of sensors that may be monitored during deposition include, but are not limited to, mass flow control modules, pressure sensors such as the pressure manometers 810, and thermocouples located in delivery system, the pedestal or chuck (e.g. the temperature sensors 814). Appropriately programmed feedback and control algorithms may be used with data from these sensors to maintain desired process conditions. The foregoing describes implementation of embodiments of the invention in a single or multi-chamber semiconductor processing tool.

Accordingly, the disclosure of the example embodiments is intended to be illustrative, but not limiting, of the scope of the disclosures, which are set forth in the following claims and their equivalents. Although example embodiments of the disclosures have been described in some detail for purposes of clarity of understanding, it will be apparent that certain changes and modifications can be practiced within the scope of the following claims. For example, in addition to being used in conjunction with a pedestal or incorporated into a pocket pedestal, focus rings providing knife-edge contact can be used with vacuum chucks. In the following claims, elements and/or steps do not imply any particular order of operation, unless explicitly stated in the claims or implicitly required by the disclosure.

What is claimed is:

1. A semiconductor system, comprising:
   a chamber;
   a pedestal disposed in the chamber, the pedestal having a center region for supporting a central region of a substrate, the center region including at least three minimum contact area supports for supporting the central region of the substrate; and
   a focus ring configured to surround the center region of the pedestal, the focus ring having an annular shape and an upper surface that extends between an inner edge side of the focus ring and an outer edge side of the focus ring, the upper surface having a substantially constant, non-zero slope between the inner edge side and outer edge side, and the upper surface providing a knife-edge contact for the substrate when present over the center region and the upper surface, the knife-edge contact for the substrate occurring on the upper surface at a location defined by a horizontal plane coincident with tops of the minimum contact area supports.

2. The system of claim 1, wherein the upper surface of the focus ring is disposed at an angle in the range from 1 degree to 25 degrees relative to a horizontal line.

3. The system of claim 1, wherein the upper surface of the focus ring is disposed at an angle in the range from 1 degree to 15 degrees relative to a horizontal line.

4. The system of claim 1, wherein the upper surface of the focus ring is disposed at an angle in the range from 5 degrees to 10 degrees relative to a horizontal line.

5. The system of claim 1, wherein the upper surface of the focus ring has a surface roughness in the range from 1-32 Ra.

6. The system of claim 1, wherein the upper surface of the focus ring has a surface roughness in the range from 2-15 Ra.

7. The system of claim 1, wherein the focus ring is comprised of a metallic material, a dielectric material, or a coated material.

8. The system of claim 1, wherein the focus ring is comprised of aluminum or stainless steel.

9. The system of claim 1, wherein the focus ring is comprised of alumina ($Al_2O_3$) or yttria ($Y_2O_3$).

10. A semiconductor system, comprising:
    a chamber; and
    a pocket pedestal disposed in the chamber, the pocket pedestal having a center region for supporting a central region of a substrate, the center region having a wafer support surface having at least three minimum contact area supports for supporting the central region of the substrate, an annular focus region that surrounds the center region, the annular focus region having a substantially flat upper surface, and an annular sloped region having a sloped surface that extends from the wafer support surface of the center region to the upper surface of the annular focus region, the sloped surface of the annular sloped region defining an annular support that provides a knife-edge contact for the substrate when present over the center region and the annular sloped region, the knife-edge contact for the substrate occurring on the sloped surface of the annular support region at a location defined by a horizontal plane coincident with tops of the minimum contact area supports.

11. The system of claim 10, wherein the sloped surface of the annular sloped region has a conical configuration.

12. The system of claim 10, wherein the sloped surface of the annular sloped region of the pocket pedestal is disposed at an angle in the range from 1 degree to 25 degrees relative to a horizontal line.

13. The system of claim 10, wherein the sloped surface of the annular sloped region of the pocket pedestal is disposed at an angle in the range from 1 degree to 15 degrees relative to a horizontal line.

14. The system of claim 10, wherein the sloped surface of the annular sloped region of the pocket pedestal is disposed at an angle in the range from 5 degrees to 10 degrees relative to a horizontal line.

15. The system of claim 10, wherein the sloped surface of the annular sloped region has a surface roughness in the range from 1-32 Ra.

16. The system of claim 10, wherein the sloped surface of the annular sloped region has a surface roughness in the range from 2-15 Ra.

17. A semiconductor system, comprising:
a chamber;
a pedestal disposed in the chamber, the pedestal having a center region for supporting a central region of a substrate and a peripheral region surrounding the center region, the center region including at least three minimum contact area supports for supporting the central region of the substrate, the peripheral region being a step down from the center region; and
a focus ring configured to surround the center region of the pedestal, the focus ring being disposed over the peripheral region of the pedestal and having an annular shape and an upper surface that extends between an inner edge side of the focus ring and an outer edge side of the focus ring, the upper surface having a substantially constant slope between the inner edge side and the outer edge side, wherein the upper surface is disposed at an angle in the range from 1 degree to 15 degrees relative to a horizontal line, the upper surface having a surface roughness in the range from 2-15 Ra, and the upper surface providing a knife-edge contact for the substrate when present over the center region and the upper surface, the knife-edge contact for the substrate occurring on the upper surface at a location defined by a horizontal plane coincident with tops of the minimum contact area supports.

18. The system of claim 17, wherein the knife-edge contact between the upper surface of the focus ring and the substrate when present seals off gaseous chemical access to a backside of the wafer to a degree sufficient to reduce backside deposition.

19. The system of claim 17, wherein the upper surface of the focus ring is disposed at an angle in the range from 5 degrees to 10 degrees relative to a horizontal line.

20. The system of claim 17, wherein the focus ring is comprised of a material selected from the group consisting of aluminum, stainless steel, alumina ($Al_2O_3$), and yttria ($Y_2O_3$).

* * * * *